(12) United States Patent
Ting

(10) Patent No.: US 10,488,990 B2
(45) Date of Patent: Nov. 26, 2019

(54) ACOUSTIC TOUCH DEVICE AND TOUCH JUDGING METHOD

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhubei (TW)

(72) Inventor: Hsiao-Chun Ting, Zhubei (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhubei (TW)

( * ) Notice: Subject to any disclaimer, the term of this patent is extended or adjusted under 35 U.S.C. 154(b) by 0 days.

(21) Appl. No.: 15/907,414

(22) Filed: Feb. 28, 2018

(65) Prior Publication Data

US 2019/0121460 A1 Apr. 25, 2019

(30) Foreign Application Priority Data

Oct. 24, 2017 (CN) .......................... 2017 1 1001037

(51) Int. Cl.
*G06F 3/045* (2006.01)
*G06F 3/043* (2006.01)
*G06F 3/01* (2006.01)
*G06K 9/00* (2006.01)
*H03K 17/96* (2006.01)

(52) U.S. Cl.
CPC .............. *G06F 3/043* (2013.01); *G06F 3/016* (2013.01); *G06K 9/00* (2013.01); *H03K 17/964* (2013.01); *H03K 2217/96003* (2013.01)

(58) Field of Classification Search
CPC .......... G06F 3/041; G06F 3/045; G06F 3/043; G06F 3/01; G01R 27/26
See application file for complete search history.

(56) References Cited

U.S. PATENT DOCUMENTS

2012/0206417 A1* 8/2012 Lee ...................... G06F 3/03545
345/177
2016/0054826 A1* 2/2016 Huppi ................... G06F 3/0436
345/177
2016/0259487 A1* 9/2016 Hong ..................... G06F 3/0436
2016/0349922 A1* 12/2016 Choi ........................ G06F 3/043
2018/0284947 A1* 10/2018 Khajeh ................. G06F 3/0436

* cited by examiner

*Primary Examiner* — Pegeman Karimi
(74) *Attorney, Agent, or Firm* — ScienBiziP, P.C.

(57) ABSTRACT

An acoustic touch device able to distinguish between user finger touches and other noise-making events includes ultrasonic transmitting and receiving units, and a controller. The ultrasonic receiving unit generates low-frequency electrical signals when the acoustic touch device is touched by an external object or affected by acoustic noise. The low frequency electrical signals cause variation in the output electrical signals of the ultrasonic receiving unit. The controller is configured to power on or power off the ultrasonic transmitting unit according to such variation.

10 Claims, 4 Drawing Sheets

ACOUSTIC TOUCH DEVICE AND TOUCH JUDGING METHOD

FIELD

The subject matter herein generally relates to an acoustic touch device and a method for touch judging of the acoustic touch device.

BACKGROUND

Nowadays, touch devices are widely used in many fields such as personal computers, smart phones, smart appliances, industrial control, and so on. Types of touch sensor, such as resistive touch sensor, photoelectric touch sensor, acoustic touch sensor, surface capacitive touch sensor, and projected capacitive touch sensor, can be used in electronic devices.

In the current technology, an acoustic wave generator of an acoustic touch device sends a high-frequency acoustic wave to a top surface of a cover. When a finger is touching the cover, a portion of the acoustic wave can be blocked by the finger, and a portion of the acoustic wave can be reflected and be received by an acoustic wave receiving element, and the acoustic wave receiving element receives the reflected acoustic wave and converts it into an electrical signal. A controller analyzes the electrical signal, and the controller determines whether the touch signal is effective. However, other factors (such as water, oil, and the like) on the acoustic touch device may affect the electrical signals of the acoustic wave receiving element, and it may be rendered difficult for conventional acoustic touch devices to distinguish a finger's touch, which may lead the acoustic touch device to wake up frequently and cause increased power consumption.

BRIEF DESCRIPTION OF THE DRAWINGS

Implementations of the present technology will now be described, by way of example only, with reference to the attached figures.

DETAILED DESCRIPTION

Figure 1:
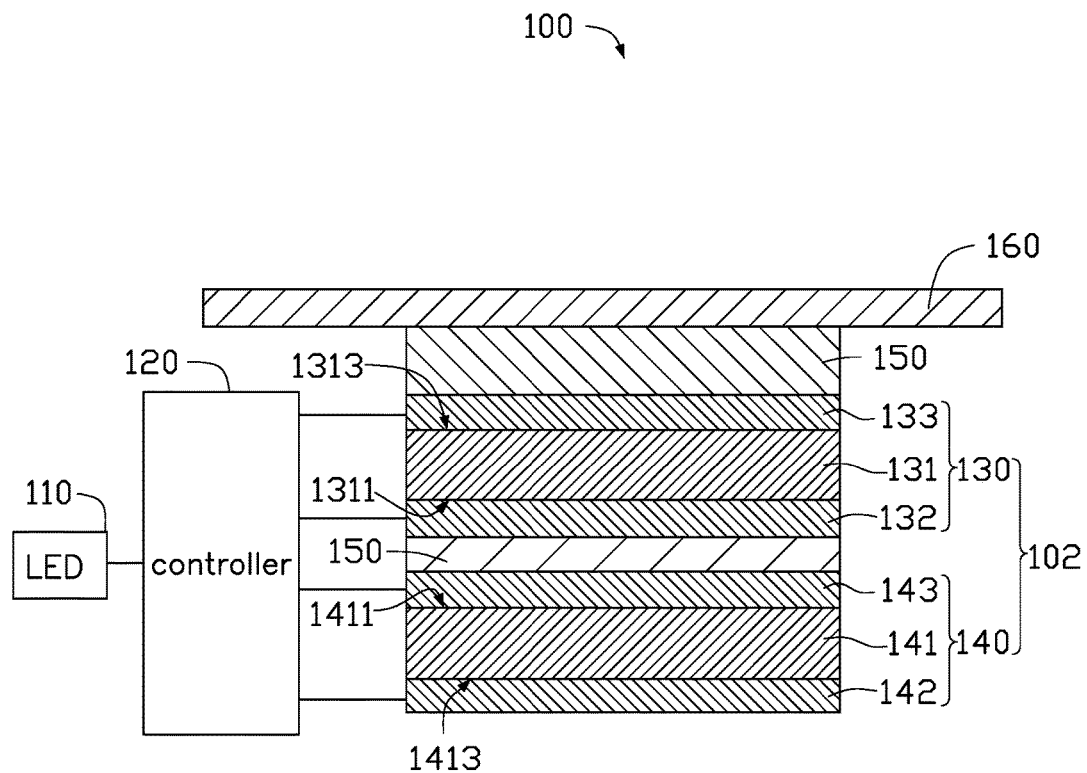
FIG. 1 is a cross-sectional view of an exemplary embodiment of an acoustic touch device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

Furthermore, the word "controller," as used hereinafter, refers to logic embodied in hardware or firmware, or to a collection of software instructions, written in a programming language, such as, for example, Java, C, or assembly. One or more software instructions in the controllers may be embedded in firmware. It will be appreciated that controllers may comprise connected logic units, such as gates and flip-flops, and may comprise programmable units, such as programmable gate arrays or processors. The controllers described herein may be implemented as either software and/or hardware controllers and may be stored in any type of non-transitory computer-readable storage medium or other computer storage device.

FIG. 1 illustrates an acoustic touch device 100 according to an exemplary embodiment. The acoustic touch device 100 includes an ultrasonic sensing element 102, at least two adhesive layers 150, a cover 160, a controller 120, and an LED indicator 110. The ultrasonic sensing element 102 includes an ultrasonic receiving unit 130 and an ultrasonic transmitting unit 140. The ultrasonic receiving unit 130 is stacked on the ultrasonic transmitting unit 140. One adhesive layer 150 is sandwiched between the ultrasonic receiving unit 130 and the ultrasonic transmitting unit 140, thus the ultrasonic receiving unit 130 and the ultrasonic transmitting unit 140 are bonded together. The cover 160 is stacked on the ultrasonic sensing element 102, and another adhesive layer 150 is sandwiched between the ultrasonic sensing element 102 and the cover 160, thus the ultrasonic sensing element 102 and the cover 160 are bonded together. In this exemplary embodiment, the ultrasonic receiving unit 130 is closer than the ultrasonic transmitting unit 140 to the cover 160.

As shown in FIG. 1, the ultrasonic receiving unit 130 includes a first piezoelectric sheet 131, a first electrode 132, and a second electrode 133. In this exemplary embodiment, the first piezoelectric sheet 131 includes a first surface 1311 and a second surface 1313, wherein the first surface 1311 and the second surface 1313 are on opposite sides facing away from each other. The first electrode 132 covers the first surface 1311 of the first piezoelectric sheet 131 and the second electrode 133 covers the second surface 1313 of the first piezoelectric sheet 131. The first electrode 132 and the second electrode 133 may be electrically coupled to a power supply circuit (not shown) by connection lines (not shown), respectively. The first electrode 132 and the second electrode 133 can be applied with different voltages, and a voltage difference exists between the first electrode 132 and the second electrode 133 to drive the first piezoelectric sheet 131 to work. When a finger or an external object contacts the cover 160 of the acoustic touch device 100, the first piezoelectric sheet 131 may deform under pressure caused by the contact. Due to the piezoelectric principle, a charge accumulation may occur in the first piezoelectric sheet 131. In additional, acoustic noise may also cause the first piezoelectric sheet 131 to vibrate/resonate, and this may also cause a charge accumulation inside. The charge accumulation caused by the above factors will generate an electrical signal at an output terminal of the ultrasonic receiving unit 130. The present disclosure defines such electrical signal as a low frequency electrical signal of the ultrasonic receiving unit 130, the low frequency electrical signal will cause output signals of the ultrasonic receiving unit 130 to vary. The controller 120 may control the ultrasonic transmitting unit 140 to be selectively powered on after analyzing variation of the output signals of the ultrasonic receiving unit 130. The inventors of the present disclosure discovers that if oil or water contacts the cover 160, the first piezoelectric sheet 131 does not deform, and output signals of the ultrasonic receiving unit 130 do not change. A force applied in the presence of oil or water is insufficient to deform or resonate the first piezoelectric sheet 131.

As shown in FIG. 1, the ultrasonic transmitting unit 140 includes a second piezoelectric sheet 141, a third electrode 142, and a fourth electrode 143. In this exemplary embodiment, the second piezoelectric sheet 141 includes a third surface 1411 and a fourth surface 1413, wherein the third surface 1411 and the fourth surface 1413 are on opposite sides facing away from each other. The fourth electrode 143 covers the third surface 1411 of the second piezoelectric sheet 141 and the third electrode 142 covers the fourth surface 1413 of the second piezoelectric sheet 141. The first electrode 132 and the second electrode 133 may be electrically coupled to a power supply circuit (not shown) by connection lines (not shown), respectively. The first electrode 132 and the second electrode 133 can be applied with different voltages, and a voltage difference is generated across the first piezoelectric sheet 131 to drive the first piezoelectric sheet 131 to emit ultrasonic waves. The ultrasonic waves emitted by the second piezoelectric sheet 141 may be reflected at the interface between the cover 160 and the air. The reflected ultrasonic wave is received by the ultrasonic receiving unit 130 and converted into an electrical signal. This electrical signal is defined as a high-frequency electrical signal of the ultrasonic receiving unit 130, which is then transmitted to the controller 120 by connection lines (not shown) and processed by the controller 120. When an external object touches or covers the cover 160, the high-frequency electrical signal varies. The controller 120 processes the variation of the high-frequency electrical signal and controls the LED indicator 110 to emit light when a touch is detected as being an effective touch (e. g. finger's touch).

The acoustic touch device 100 further includes at least two different signal capture circuits (not shown). One of the signal capture circuits captures signal with a higher frequency (ie, the high-frequency electrical signal output by the ultrasonic receiving unit 130). The other signal capture circuit captures lower frequency electrical signal output by the output terminal of the ultrasonic receiving unit 130.

The fourth electrode 143 of the ultrasonic transmitting unit 140 is bonded to the first electrode 132 of the ultrasonic receiving unit 130 by the adhesive layer 150. The adhesive layer 150 between the first electrode 132 and the fourth electrode 143 may be an electrical insulator to insulate the first electrode 132 from the fourth electrode 143.

The cover 160 provides a touch operation interface of the acoustic touch device 100. The cover 160 is bonded to the second electrode 133 of the ultrasonic receiving unit 130 by the adhesive layer 150. In other embodiments, the cover 160 can also be adhered to the ultrasonic transmitting unit 140.

The first electrode 132, the second electrode 133, the third electrode 142 and the fourth electrode 143 are made of conductive metal, such as copper, silver, gold, or magnesium-aluminum alloy. The first piezoelectric sheet 131 and the second piezoelectric sheet 141 may be made of zirconium lead titanate piezoelectric ceramics.

Figure 2:
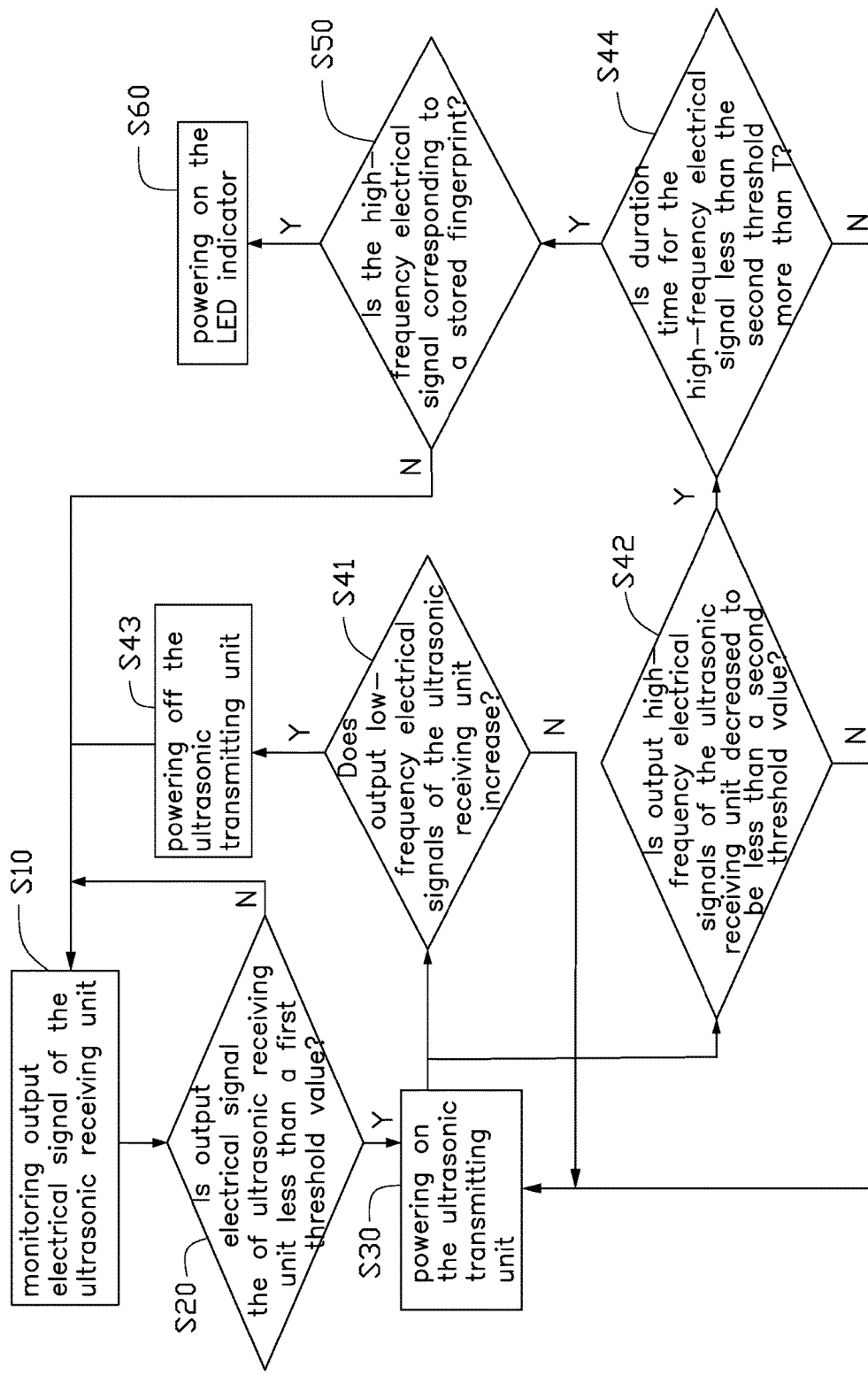
FIG. 2 is a schematic flow chart of a method for touch judging by using the acoustic touch device.

FIG. 2 illustrates a method for touch judging by using the acoustic touch device 100. The method is based on experimental findings of the inventor of the present invention and some principles. It is found that when the ultrasonic transmitting unit 140 is not operating, that is, when no ultrasonic wave is being emitted by the ultrasonic transmitting unit 140, and the acoustic touch device 100 is touched by external objects, such as oil, water, and other contaminants, the output voltage of the ultrasonic receiving unit 130 does not decrease. If the acoustic touch device 100 is touched by finger or impacted physically, the output voltage of the ultrasonic receiving unit 130 does decrease. On the other hand, when the ultrasonic transmitting unit 140 is working, that is, when the ultrasonic transmitting unit 140 is emitting ultrasonic waves, behavior is different when a finger touches the acoustic touch device 100. This is due to tiny ravines on the skin surface of the finger, some parts of the finger skin directly contacting the contact surface of the acoustic touch device 100, and other parts of the finger skin not being in direct contact with the contact surface. When the finger actually touches the contact surface, a portion of the ultrasonic wave signals is reflected back, a portion of the ultrasonic wave signals penetrating the finger skin. The amplitude of the ultrasonic wave received by the ultrasonic receiving unit 130 may thereby decrease, and frequency of the output electrical signal of the ultrasonic receiving unit 130 may also decrease. If the ultrasonic wave transmitting unit 140 is disturbed by resonance caused by external acoustic noise or physical impact, there being no external object which contacts the contact surface of the acoustic touch device 100, the ultrasonic wave is reflected after encountering mere air. Herein, amplitude of the ultrasonic wave received by the ultrasonic receiving unit 130 does not decrease or only decreases to a small extent, and frequency of the output electrical signal of the ultrasonic receiving unit 130 does not decrease or decreases only to a lesser extent.

A method for touch judging by using the acoustic touch device 100 according to an exemplary embodiment of the present disclosure includes the following steps.

Step S10: as shown in FIG. 2, the controller 120 continuously monitors the low-frequency electric signal (the voltage value in this embodiment) at the output terminal of the ultrasonic receiving unit 130, the ultrasonic transmitting unit 140 being powered off.

The ultrasonic receiving unit 130 and the ultrasonic transmitting unit 140 are electrically coupled to the power supply circuit (not shown) and the controller 120 by electrical connecting wires (not shown). The power supply circuit provides working voltages for the ultrasonic receiving unit 130 and the ultrasonic transmitting unit 140. The controller 120 can read the low-frequency electrical signal at output terminal of the ultrasonic receiving unit 130.

When the ultrasonic transmitting unit 140 is powered off but the first piezoelectric sheet 131 is deformed or vibrated by some external force, the voltage at the output terminal of the ultrasonic receiving unit 130 changes. The low-frequency electrical signal is generated at the output terminal of the ultrasonic receiving unit 130, and the low-frequency electrical signal causes the electrical signal at the output terminal of the ultrasonic receiving unit 130 to change. The external force may be during direct physical contact such as crushing, colliding, or the like, or acoustic wave noise.

Step S20: the controller 120 determines whether the electrical signal at the output terminal of the ultrasonic receiving unit 130 reaches a first threshold value (whether it is less than the first threshold value). If yes, it is less than the first threshold value, the procedure goes to step S30. Otherwise, the procedure goes to step S10.

When a finger or other object physically contacts (such as touching, snapping, pressing) the acoustic touch device 100, deformation of the first piezoelectric sheet 131 in the ultrasonic wave receiving unit 130 is caused. Or, acoustic noise may cause resonance in the first piezoelectric sheet 131 in the ultrasonic receiving unit 130; electric charge in the first piezoelectric sheet 131 may change and the low frequency electric signal (in this exemplary embodiment, voltage is the low frequency electric signal) at the output terminal of the ultrasonic wave receiving unit 130 is decreased so as to be less than the first threshold value. The first threshold value can be adjusted as necessary. When liquid such as water or oil is present on the acoustic touch device 100, the voltage at the output terminal of the ultrasonic receiving unit 130 does not decrease, as the oil or water liquid has insufficient force to deform or resonate the first piezoelectric sheet 131.

When an ultrasonic noise, a finger, or other object (not oil and not water) acts on or touches the acoustic touch device 100, output voltage of the ultrasonic wave receiving unit 130 decreases. In this case, factors causing the voltage change are analyzed, and determination is made as to whether the voltage value at the output terminal of the ultrasonic receiving unit 130 is less than the first threshold value. If the voltage value at the output terminal of the ultrasonic receiving unit 130 is found to be less than the first threshold value, step S30 is executed. If not less than the first threshold value, step S10 is repeated.

Step S20 can occur in such a way as to avoid waking up the ultrasonic transmitting unit 140 when water or oil are present on the acoustic touch device 100.

Step S30: as shown in FIG. 2, the ultrasonic transmitting unit 140 is powered on, and the procedure goes to step S41 and Step S42.

The ultrasonic transmitting unit 140 is connected to the power supply circuit (not shown) and the controller 120 by connection lines (not shown), and the power supply circuit can provide the ultrasonic transmitting unit 140 with the necessary operating voltage. The ultrasonic transmitting unit 140 continuously emits ultrasonic waves, and the ultrasonic waves reflect from any interface between solid matter and the air. The ultrasonic receiving unit 130 receives the reflected ultrasonic waves, converts the ultrasonic signals into the high-frequency electric signals, and transmits the high-frequency electric signals to the controller 120. In this exemplary embodiment, voltage is used to characterize the high-frequency electrical signal. It should be noted that when the ultrasonic transmitting unit 140 is powered on, the ultrasonic receiving unit 130 receives the reflected ultrasonic waves and generates high-frequency electrical signals; meantime the ultrasonic receiving unit 130 is also receiving external disturbances and generating low-frequency electrical signals. The ultrasonic receiving unit 130 transmits the high-frequency electrical signals and the low-frequency electric signals to the controller 120. The frequency of the ultrasonic waves is generally two thousand to ten thousand hertz and the frequency caused by ordinary noise or touches is far less than the frequency of the ultrasonic waves. That is, the frequencies of the two electric signals are different, and each electric signal can be selected by a specific signal capturing circuit (not shown). There are at least two different signal capturing circuits (not shown); one of the signal capture circuits captures a higher frequency electrical signal output by the ultrasonic receiving unit 130, and the other one of the signal capture circuits captures a lower frequency electrical signal output by the ultrasonic receiving unit 130.

Figure 3:
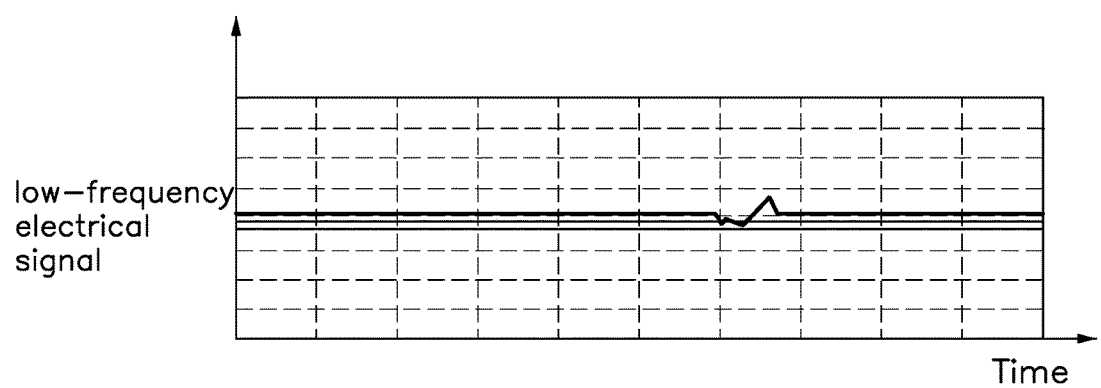
FIG. 3 is a schematic diagram showing change of electrical signals output by an ultrasonic wave receiving unit of the acoustic touch device of FIG. 1 when a finger touches the acoustic touch device while the ultrasonic transmitting unit is not emitting ultrasonic waves.

As shown in FIG. 3, when the low-frequency electrical signal at the output terminal of the ultrasonic receiving unit 130 increases to be above the first threshold value, it means that the above influencing factors on the touch device have been removed. For example, when the finger leaves the acoustic touch device 100, the voltage at the output terminal of the ultrasonic receiving unit 130 (the low-frequency electrical signal) will increase, thus it is meaningless to continuously detect the finger. When the influencing factors are being detected, it is necessary to determine whether the influencing factors on the acoustic touch device 100 are continuing. Therefore, steps S41 and S42 need to be performed at the same time.

Step S41: as shown in FIG. 2, the controller 120 detects whether the low-frequency electrical signal at the output terminal of the ultrasonic receiving unit 130 increase so as to be above the first threshold value. If yes, the procedure goes to step S43, and if not, the procedure returns to step S30.

If the low-frequency electrical signal increases, it means that the external factors influencing the acoustic touch device 100 have been removed. Otherwise, the ultrasonic transmitting unit 140 must keep powering on and the low-frequency electrical signal at the output terminal of the ultrasonic receiving unit 130 must be continuously monitored.

Step S42: The controller 120 analyzes the high frequency electrical signal transmitted and converted by the ultrasonic receiving unit 130 and determines whether the high frequency electrical signal remains less than a second threshold. If yes, the procedure goes to step S44. Otherwise, the procedure returns to step S30.

Figure 4:
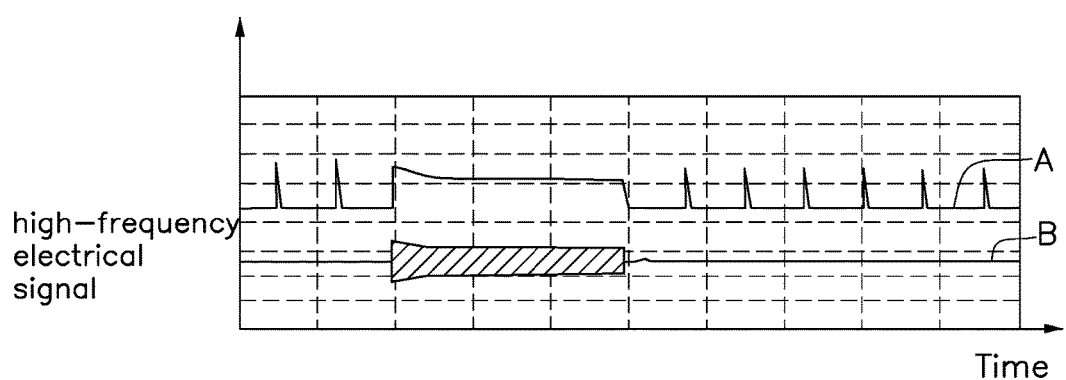
FIG. 4 is a schematic diagram showing change of the electrical signals output by the ultrasonic wave receiving unit of the acoustic touch device of FIG. 1 when a finger touches the acoustic touch device and the ultrasonic transmitting unit is emitting ultrasonic waves.

Due to tiny ravines on the skin surface of the finger, when the finger touches the contact surface of the acoustic touch device 100, amplitude of the ultrasonic wave received by the ultrasonic receiving unit 130 may decrease, and frequency of the high-frequency electrical signal may also decrease, as shown in FIG. 4. Other physical events such as minor impacts may also cause the above described variation of the high-frequency electric signal. However, variation of the high-frequency electric signal of the ultrasonic receiving unit 130 caused by a finger has a specific value, and this enables the touch of a finger to be distinguished from other physical events. If the resonance caused by the acoustic noise causes the ultrasonic transmitting unit 140 to emit ultrasonic wave signals, as there is no object covering the contact surface, the ultrasonic wave signals are reflected when encountering the air, and ultrasonic amplitude of the ultrasonic receiving unit 130 will not be decreased, or only decreased to a lesser extent. Thus, the high-frequency signal does not decrease to be less than the second threshold value, thus is not caused by finger touching, but is caused by acoustic noise or the like.

Step S42 is to avoid misinterpretation of acoustic noise but there is a special case that there is an object covering the acoustic touch device 100 and an acoustic noise wakes up the acoustic touch device 100. In this case, step S42 cannot exactly distinguish the special case from the finger touch, and step S44 needs to be performed.

Step S43: the ultrasonic transmitting unit 140 is powered off, and the procedure return to step S10.

The influencing factors on the acoustic touch device 100 have been removed, and the acoustic touch device 100 returns to the original working state.

Step S44: the controller 120 determines whether the duration time of the high-frequency electrical signal value being less than the second threshold value is greater than T. If yes, the procedure goes to step S50. Otherwise, the procedure returns to step S30.

If the high-frequency electrical signal of the ultrasonic wave receiving unit 130 is less than the second threshold value, duration time of the high-frequency electric signal being less than the second threshold value must be determined. Generally, if a finger makes a touch, the duration time of the high-frequency electric signal being less than the second threshold value is at least 0.1 second. However, if the high-frequency electrical signal is caused by acoustic noise, duration time of the high-frequency electric signal being less than the second threshold value is less than 0.1 second. The high-frequency electrical signal caused by different factors can be effectively distinguished by determining the duration of the high-frequency electric signal being less than the second threshold value. Thus, in this exemplary embodiment, T can be set to be 0.1 second. In other embodiments, T can be adjusted according to the actual product application.

Step S50: the controller 120 determines whether the high-frequency electrical signal corresponds to a stored fingerprint. If yes, the procedure goes to step S60; otherwise, the procedure goes back to step S10.

The controller 120 analyzes the high-frequency electric signal by using current fingerprint identification and verification technology to determine whether the high-frequency electric signal corresponds to the stored fingerprint in the controller 120.

Step S60: the LED indicator is powered on.

The LED indicator emits light to indicate that the procedure has been completed.

The high-frequency electric signal and the low-frequency electric signal in this embodiment are both characterized by a voltage. In other embodiments, they can be characterized by a current.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. An acoustic touch device, comprising:
   an ultrasonic receiving layer configured to receive ultrasonic waves;
   an ultrasonic transmitting layer configured to emit ultrasonic waves; and
   a controller electrically coupled to the ultrasonic receiving layer and the ultrasonic transmitting layer;
   wherein the ultrasonic receiving layer is capable of generating low-frequency electrical signals when the acoustic touch device is touched by an external object or affected by an acoustic noise, the low frequency electrical signals cause output electrical signals of the ultrasonic receiving layer to vary, the controller is configured to determine whether power on or power off the ultrasonic transmitting layer according to variation of the output electrical signals of the ultrasonic receiving layer.

2. The acoustic touch device of claim 1, wherein the ultrasonic receiving layer is capable of receiving ultrasonic waves and generating high-frequency electrical signals.

3. The acoustic touch device of claim 2, wherein the controller is capable of monitoring variation of output electrical signal of the ultrasonic receiving layer and determining whether there is a finger touch on the acoustic touch device or not.

4. The acoustic touch device of claim 3, wherein the controller controls the ultrasonic transmitting layer to power on when the electrical signal at the output terminal of the ultrasonic receiving layer decreases to be less than a first threshold value.

5. The acoustic touch device of claim 2, wherein when the ultrasonic transmitting layer is powered on, the ultrasonic receiving layer is capable of transmitting the high-frequency electrical signals and the low-frequency electrical signals to the controller.

6. The acoustic touch device of claim 1, further comprising a LED indicator electrically coupled to the controller, wherein the LED indicator is powered on when the controller detects a finger is touching on the acoustic touch device.

7. A method for touch judging by using an acoustic touch device, the acoustic touch device, comprising: an ultrasonic receiving layer configured to receive ultrasonic waves; an ultrasonic transmitting layer configured to emit ultrasonic waves; and a controller electrically coupled to the ultrasonic receiving layer and the ultrasonic transmitting layer; the method comprising:
   monitoring output electrical signal of the ultrasonic receiving layer by the controller and keeping the ultrasonic transmitting layer power off;
   determining by the controller whether the output electrical signal of the ultrasonic receiving layer is less than a first threshold value;
   powering on the ultrasonic transmitting layer by the controller if the output electrical signal of the ultrasonic receiving layer was less than a first threshold value;
   determining by the controller whether output low-frequency electrical signals of the ultrasonic receiving layer increase or not;
   powering off the ultrasonic transmitting layer by the controller determining if the output low-frequency electrical signals of the ultrasonic receiving layer increases to be above the first threshold value;
   determining by the controller whether output high-frequency electrical signals of the ultrasonic receiving layer is decreased to be less than a second threshold value;
   determining by the controller whether the duration time for the high-frequency electrical signal being less than the second threshold is greater than a value of T.

8. The method of claim 7, further comprising: determining by the controller whether the high-frequency electrical signal is corresponding to a stored fingerprint in the controller.

9. The method of claim 8, further comprising: powering on a LED indicator by the controller if the high-frequency electrical signal is corresponding to a stored fingerprint in the controller.

10. The method of claim 8, wherein if the high-frequency electrical signal is not corresponding to a stored fingerprint in the controller, the controller keeps monitoring output electrical signal of the ultrasonic receiving layer.

* * * * *